US012742832B2

(12) United States Patent
Kim et al.

(10) Patent No.: US 12,742,832 B2
(45) Date of Patent: Sep. 22, 2026

(54) BATTERY DIAGNOSIS DEVICE, BATTERY MANAGEMENT SYSTEM, BATTERY PACK, ELECTRIC VEHICLE AND BATTERY DIAGNOSIS METHOD

(71) Applicant: LG Energy Solution, Ltd., Seoul (KR)

(72) Inventors: Young-Min Kim, Daejeon (KR); Yong-Chul Sung, Daejeon (KR); Cheol-Taek Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 387 days.

(21) Appl. No.: 18/269,315

(22) PCT Filed: Sep. 6, 2022

(86) PCT No.: PCT/KR2022/013350
§ 371 (c)(1),
(2) Date: Jun. 23, 2023

(87) PCT Pub. No.: WO2023/038398
PCT Pub. Date: Mar. 16, 2023

(65) Prior Publication Data

US 2024/0066993 A1 Feb. 29, 2024

(30) Foreign Application Priority Data

Sep. 8, 2021 (KR) ........................ 10-2021-0120039

(51) Int. Cl.
*G01R 31/396* (2019.01)
*B60L 3/00* (2019.01)
(Continued)

(52) U.S. Cl.
CPC .......... *G01R 31/396* (2019.01); *B60L 3/0046* (2013.01); *G01R 31/50* (2020.01);
(Continued)

(58) Field of Classification Search
CPC ...... G01R 31/396; G01R 31/50; G01R 31/66; G01R 31/367; G01R 31/3842; G01R 31/392; B60L 3/0046; H02J 7/0049
See application file for complete search history.

(56) References Cited

U.S. PATENT DOCUMENTS 12,085,626 B2 * 9/2024 Lee ...................... G01R 31/396
2011/0187329 A1 8/2011 Majima et al.
(Continued)

FOREIGN PATENT DOCUMENTS

CN 103091636 A 5/2013
CN 109017355 A 12/2018
(Continued)

OTHER PUBLICATIONS

Extended European Search Report including Written Opinion for Application No. 22867667.2 dated Jun. 26, 2024, pp. 1-7.
(Continued)

*Primary Examiner* — John C Kuan
(74) *Attorney, Agent, or Firm* — Lerner David LLP

(57) ABSTRACT

A battery diagnosis device for a battery including a parallel connection structure of unit cells includes a processor and memory having programmed thereon instructions that, when executed, are configured to cause the processor to collect charge/discharge data including a voltage time series indicating a time-dependent change of a voltage across the battery and a current time series indicating a time-dependent change of a charge/discharge current flowing through the battery; determine an estimated capacity value indicating a full charge capacity of the battery based on the charge/discharge data; and diagnose an abnormality in the parallel connection structure by monitoring a time-dependent change of the estimated capacity value.

13 Claims, 6 Drawing Sheets

(51) Int. Cl.

| | |
|---|---|
| ***G01R 31/367*** | (2019.01) |
| ***G01R 31/3842*** | (2019.01) |
| ***G01R 31/392*** | (2019.01) |
| ***G01R 31/50*** | (2020.01) |
| ***G01R 31/66*** | (2020.01) |
| *H02J 7/82* | (2026.01) |

(52) U.S. Cl.
CPC ............ *G01R 31/66* (2020.01); *G01R 31/367* (2019.01); *G01R 31/3842* (2019.01); *G01R 31/392* (2019.01); *H02J 7/825* (2026.01)

(56) References Cited

U.S. PATENT DOCUMENTS

| | | | | |
|---|---|---|---|---|
| 2013/0124029 | A1 | 5/2013 | Izumi | |
| 2013/0320989 | A1 | 12/2013 | Inoue et al. | |
| 2014/0335387 | A1* | 11/2014 | Takahashi | G01R 31/387 429/61 |
| 2014/0368206 | A1* | 12/2014 | Aoshima | H01M 10/486 324/426 |
| 2015/0070024 | A1 | 3/2015 | Kim et al. | |
| 2015/0268309 | A1* | 9/2015 | Kim | G01R 31/392 324/432 |
| 2015/0301123 | A1* | 10/2015 | Tao | B60L 58/16 324/426 |
| 2016/0028254 | A1 | 1/2016 | Honoki et al. | |
| 2020/0025832 | A1 | 1/2020 | Cho et al. | |
| 2020/0049773 | A1 | 2/2020 | Cho et al. | |
| 2020/0110134 | A1* | 4/2020 | Li | G01R 31/374 |
| 2020/0112183 | A1 | 4/2020 | Tomura et al. | |
| 2020/0266645 | A1 | 8/2020 | Kim et al. | |
| 2021/0027130 | A1 | 1/2021 | Ette et al. | |
| 2021/0086661 | A1* | 3/2021 | Furukawa | H02J 7/0016 |
| 2021/0271303 | A1 | 9/2021 | Vichare et al. | |
| 2022/0131214 | A1 | 4/2022 | Wankewycz et al. | |
| 2022/0276319 | A1 | 9/2022 | Kim | |
| 2022/0317192 | A1 | 10/2022 | Lee et al. | |
| 2023/0266399 | A1* | 8/2023 | Ishii | H02J 7/005 702/63 |

FOREIGN PATENT DOCUMENTS

| | | | |
|---|---|---|---|
| CN | 111257784 | A | 6/2020 |
| CN | 112793463 | A | 5/2021 |
| CN | 120999752 | A | 11/2025 |
| JP | 2009257928 | A | 11/2009 |
| JP | 2012029455 | A | 2/2012 |
| JP | 2014032825 | A | 2/2014 |
| JP | 2015040832 | A | 3/2015 |
| JP | 2015184194 | A | 10/2015 |
| JP | 5815195 | B2 | 11/2015 |
| JP | 2020060404 | A | 4/2020 |
| KR | 20130121143 | A | 11/2013 |
| KR | 20150029204 | A | 3/2015 |
| KR | 20160109574 | A | 9/2016 |
| KR | 20200019083 | A | 2/2020 |
| KR | 20200101754 | A | 8/2020 |
| KR | 102266591 | B1 | 6/2021 |
| KR | 20210080069 | A | 6/2021 |
| WO | 2014147973 | A1 | 9/2014 |
| WO | 2017098686 | A1 | 6/2017 |
| WO | 2020159443 | A1 | 8/2020 |
| WO | 2021107655 | A1 | 6/2021 |

OTHER PUBLICATIONS

International Search Report PCT/KR2022/013350 mailed Dec. 23, 2022. 3 pages.

Search Report dated Oct. 29, 2025 from the Office Action for Chinese Application No. 202280008020.6 issued Oct. 31, 2025, pp. 1-3.

Duan, Z. C.,“ Early multiple-fault diagnosis of series battery pack based on charging voltage[J]”, Journal: Energy Storage Science and Technology, Oct. 2023, 2 pages.

* cited by examiner

Figure 6:
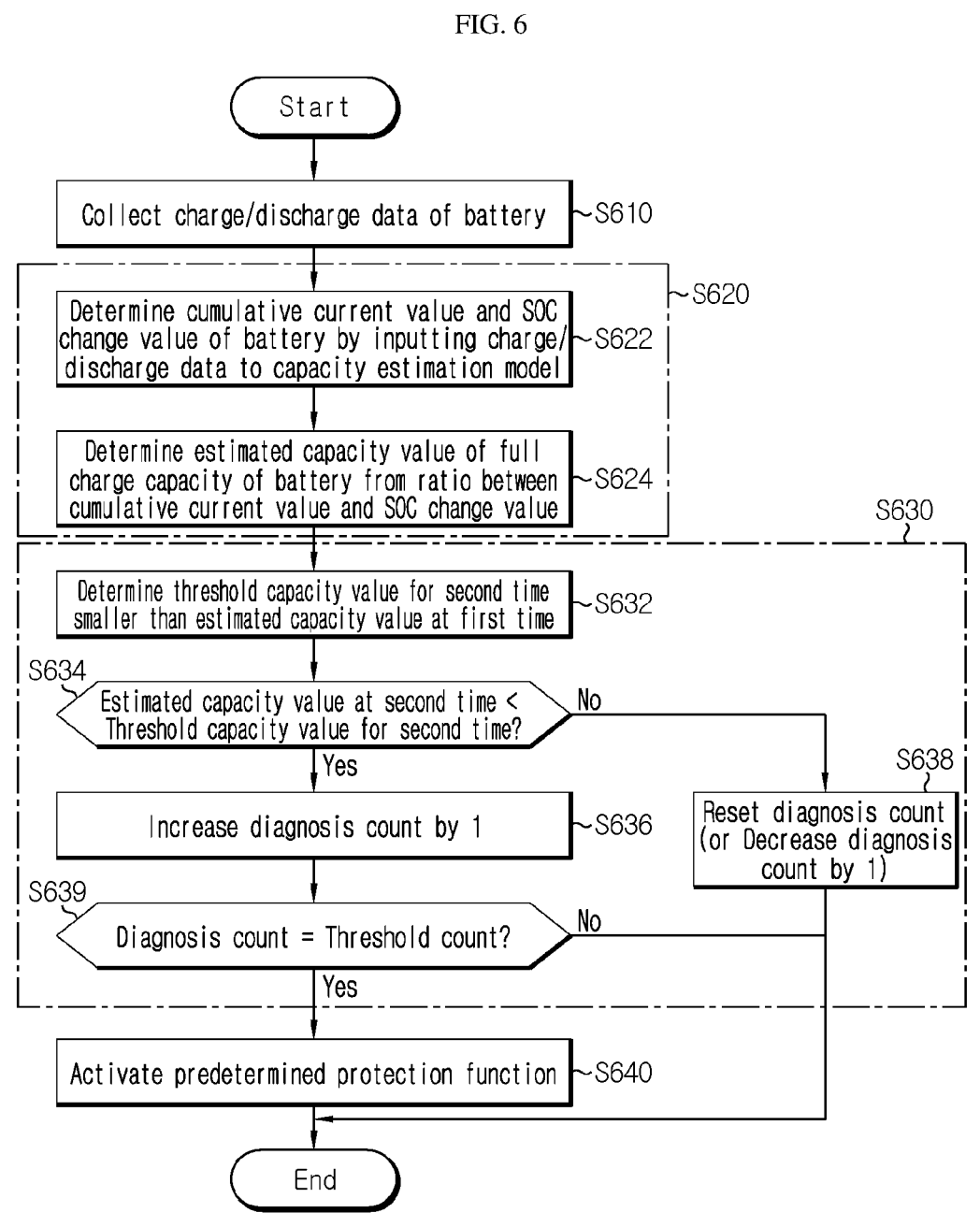

Start

Collect charge/discharge data of battery ~S610

~S620

Determine cumulative current value and SOC change value of battery by inputting charge/discharge data to capacity estimation model ~S622

Determine estimated capacity value of full charge capacity of battery from ratio between cumulative current value and SOC change value ~S624

S630

Determine threshold capacity value for second time smaller than estimated capacity value at first time ~S632

S634

Estimated capacity value at second time < Threshold capacity value for second time?

No

Yes

Increase diagnosis count by 1 ~S636

S638

Reset diagnosis count (or Decrease diagnosis count by 1)

S639

Diagnosis count = Threshold count?

No

Yes

Activate predetermined protection function ~S640

End

BATTERY DIAGNOSIS DEVICE, BATTERY MANAGEMENT SYSTEM, BATTERY PACK, ELECTRIC VEHICLE AND BATTERY DIAGNOSIS METHOD

CROSS-REFERENCE TO RELATED APPLICATION

The present application is a national phase entry under 35 U.S.C. § 371 of International Application No. PCT/KR2022/013350 filed on Sep. 6, 2022 which claims priority to Korean Patent Application No. 10-2021-0120039 filed on Sep. 8, 2021 in the Republic of Korea, the disclosures of which are incorporated hereinby reference.

TECHNICAL FIELD

The present disclosure relates to abnormality detection in a parallel connection structure of unit cells in a battery from a time-dependent change of full charge capacity of the battery.

BACKGROUND ART

Recently, there has been a rapid increase in the demand for portable electronic products such as laptop computers, video cameras and mobile phones, and with the development of electric vehicles, batteries for energy storage, robots and satellites, many studies are being made on high performance batteries that can be repeatedly recharged.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

A battery may be manufactured by receiving an electrode assembly in a packaging material together with an electrolyte and sealing up the packaging material. The electrode assembly includes a plurality of unit cells connected in parallel, and is referred to as a parallel connection structure of unit cells. Here, the unit cell refers to a smallest unit of an energy storage device that can be independently recharged. For example, the unit cell may be a full-cell including at least one of a mono-cell or a bi-cell.

Abnormalities may occur in the parallel connection structure inside of the battery due to various factors, for example, errors in the battery fabrication, ageing caused by the repeated charging and discharging and external impacts. The capacity abnormality of the battery may be divided into two types. The first type abnormality refers to a temporary failure to contribute to the charge/discharge of the battery due to micro damage and/or incomplete cut off fault in connected portions (for example, electrode tabs) of some unit cells of the parallel connection structure. The second type abnormality refers to a permanent failure to contribute to the charge/discharge of the battery due to irrecoverable rupture of some unit cells of the parallel connection structure.

In particular, when the parallel connection structure of the battery has the second type abnormality, compared to the first type capacity abnormality, charging/discharging is concentrated in the normal unit cells, resulting in increased fire and explosion risks of the battery.

SUMMARY

Technical Problem

The present disclosure is designed to solve the above-described problem, and therefore the present disclosure is directed to providing a battery diagnosis device and a battery diagnosis method for detecting an abnormality in a parallel connection structure of unit cells in a battery beforehand by monitoring a time-dependent change of full charge capacity through the repeated determination of the full charge capacity of the battery.

These and other objectives and advantages of the present disclosure may be understood by the following description and will be apparent from an embodiment of the present disclosure. In addition, it will be readily understood that the objectives and advantages of the present disclosure may be realized by the means set forth in the appended claims and a combination thereof.

Technical Solution

A battery diagnosis device for a battery including a parallel connection structure of unit cells according to an aspect of the present disclosure includes a processor; and memory having programmed thereon instructions that, when executed, are configured to cause the processor to collect charge/discharge data including a voltage time series indicating a time-dependent change of a voltage across the battery and a current time series indicating a time-dependent change of a charge/discharge current flowing through the battery; determine an estimated capacity value indicating a full charge capacity of the battery based on the charge/discharge data; and diagnose an abnormality in the parallel connection structure by monitoring a time-dependent change of the estimated capacity value.

The instructions are further configured to cause the processor to determine a cumulative current value and a state of charge (SOC) change value of the battery, and determine the estimated capacity value from a ratio between the cumulative current value and the SOC change value.

The instructions may be further configured to cause the processor to diagnose the abnormality in the parallel connection structure based on two estimated capacity values at a first time at a first time interval and a second time shifted by a second time interval which is equal to or larger than the first time interval.

The instructions may be further configured to cause the processor to determine a threshold capacity value for the second time smaller than the estimated capacity value at the first time, and diagnose the abnormality in the parallel connection structure by comparing the estimated capacity value at the second time with the threshold capacity value.

The instructions may be further configured to cause the processor to determine the threshold capacity value by subtracting a reference capacity value from the estimated capacity value at the first time.

The instructions may be further configured to determine the threshold capacity value by multiplying the estimated capacity value at the first time by a reference factor of less than 1.

When the estimated capacity value at the second time is less than the threshold capacity value, the instructions may be further configured to increase a diagnosis count and diagnose that the parallel connection structure is faulty in response to the diagnosis count reaching a threshold count.

The instructions may be further configured to determine a number of faulty unit cells among the plurality of unit cells from the two estimated capacity values at two past times at a time interval which is equal to or less than the second time interval, at which a maximum reduction of the full charge capacity is found, when it is diagnosed that the parallel connection structure is faulty.

A battery pack according to another aspect of the present disclosure includes the battery diagnosis device.

An electric vehicle according to still another aspect of the present disclosure includes the battery pack.

A battery diagnosis method for a battery including a parallel connection structure of unit cells according to yet another aspect of the present disclosure includes collecting, by one or more processors, charge/discharge data including a voltage time series indicating a time-dependent change of a voltage across the battery and a current time series indicating a time-dependent change of a charge/discharge current flowing through the battery; determining, by the one or more processors, an estimated capacity value indicating a full charge capacity of the battery based on the charge/discharge data; and diagnosing an abnormality in the parallel connection structure by monitoring a time-dependent change of the estimated capacity value.

The step of determining, by the one or more processors, the estimated capacity value indicating the full charge capacity of the battery may include determining, by the one or more processors, a cumulative current value and a SOC change value of the battery; and determining, by the one or more processors, the estimated capacity value from a ratio between the cumulative current value and the SOC change value.

The step of diagnosing, by the one or more processors, the abnormality in the parallel connection structure may be based on two estimated capacity values at a first time at a first time interval and a second time shifted by a second time interval which is equal to or larger than the first time interval.

The step of diagnosing, by the one or more processors, the abnormality in the parallel connection structure may include determining, by the one or more processors, a threshold capacity value for the second time smaller than the estimated capacity value at the first time; and diagnosing, by the one or more processors, the abnormality in the parallel connection structure by comparing the estimated capacity value at the second time with the threshold capacity value.

Advantageous Effects

According to at least one of the embodiments of the present disclosure, it is possible to detect an abnormality in the parallel connection structure of unit cells in the battery by monitoring a time-dependent change of full charge capacity through the repeated determination of the full charge capacity of the battery.

Additionally, according to at least one of the embodiments of the present disclosure, it is possible to eliminate the fire and explosion risks of the battery beforehand by taking an appropriate protection action in response to abnormality in the parallel connection structure being detected.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate an exemplary embodiment of the present disclosure, and together with the detailed description of the present disclosure as described below, serve to provide a further understanding of the technical aspects of the present disclosure, and thus the present disclosure should not be construed as being limited to the drawings.

FIG. 2 is a schematic diagram exemplarily showing a battery shown in FIG. 1.

FIG. 4 is a diagram referenced in describing a second capacity abnormality (a complete cut-off fault) of a battery.

FIG. 6 is a flowchart exemplarily showing a battery diagnosis method according to an embodiment of the present disclosure.

DETAILED DESCRIPTION

Figure 1:
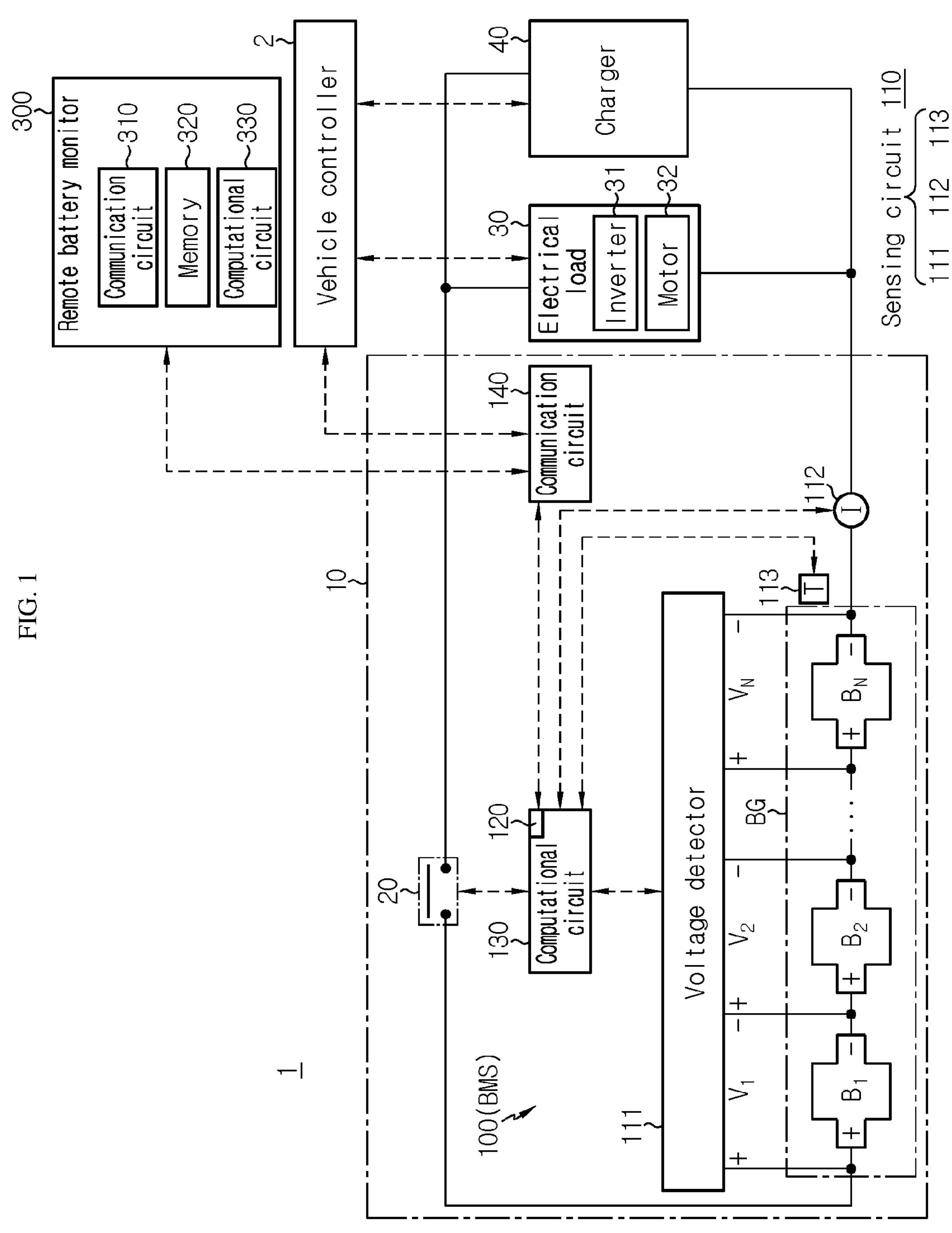
FIG. 1 is a diagram exemplarily showing an electric vehicle according to the present disclosure.

Hereinafter, an exemplary embodiment of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and the illustrations shown in the drawings are just an exemplary embodiment of the present disclosure, but not intended to fully describe the technical aspects of the present disclosure, so it should be understood that a variety of other equivalents and modifications could have been made thereto at the time that the application was filed.

The terms including the ordinal number such as “first”, “second” and the like, are used to distinguish one element from another among various elements, but not intended to limit the elements.

Unless the context clearly indicates otherwise, it will be understood that the term “comprises” when used in this specification, specifies the presence of stated elements, but does not preclude the presence or addition of one or more other elements. Additionally, the term “unit” as used herein refers to a processing unit of at least one function or operation, and may be implemented in hardware and software either alone or in combination.

In addition, throughout the specification, it will be further understood that when an element is referred to as being “connected to” another element, it can be directly connected to the other element or intervening elements may be present.

FIG. 1 is a diagram exemplarily showing an electric vehicle according to the present disclosure.

Referring to FIG. 1, the electric vehicle 1 includes a vehicle controller 2, a battery pack 10 and an electrical load 30. Charge/discharge terminals P+, P− of the battery pack 10 may be electrically coupled to a charger 40 through a charging cable. The charger 40 may be included in the electric vehicle 1 or provided in a charging station outside of the electric vehicle 1.

The vehicle controller 2 (for example, an Electronic Control Unit (ECU)) is configured to transmit a key-on signal to a battery management system 100 in response to an ignition button (not shown) of the electric vehicle 1 being switched to an ON-position by a user. The vehicle controller 2 is configured to transmit a key-off signal to the battery management system 100 in response to the ignition button being switched to an OFF-position by the user. The charger 40 may supply a charge power of constant current or constant voltage through the charge/discharge terminals P+, P− of the battery pack 10 via communication with the vehicle controller 2.

The battery pack 10 includes a battery group BG, a relay 20 and the battery management system 100.

The battery group BG includes at least one battery B. For example, the battery B is not limited to a particular type and may include any type of cell that can be repeatedly recharged such as lithium ion cells. FIG. 1 illustrates the battery group BG as a series connection structure of batteries $B_1$~$B_N$ (N is a natural number of 2 or greater). The plurality of batteries $B_1$~$B_N$ may be manufactured with the same electrical and chemical specification. Hereinafter, in the common description of the plurality of batteries $B_1$~$B_N$, the symbol 'B' is affixed to the battery.

A relay 20 is electrically connected in series to the battery group BG through a power path connecting the battery group BG and an inverter 31. FIG. 1 shows that the relay 20 is connected between the positive terminal of the battery group BG and one terminal P+ of the charge/discharge terminals. The on-off control of the relay 20 is performed in response to a switching signal from the battery management system 100. The relay 20 may be a mechanical contactor that is turned on/off by the magnetic field of the coil or a semiconductor switch such as Metal Oxide Semiconductor Field Effect transistor (MOSFET).

The electrical load 30 includes the inverter 31 and an electric motor 32. The inverter 31 is provided to convert direct current (DC) power from the battery group BG included in the battery pack 10 to alternating current (AC) power in response to a command from the battery management system 100 or the vehicle controller 2. The electric motor 32 operates using the AC power from the inverter 31. The electric motor 32 may include, for example, a 3-phase AC motor.

The battery management system 100 includes a sensing circuit 110, memory 120 and a computational circuit 130. The battery management system 100 may further include a communication circuit 140. The battery management system 100 is an example of a ⌈battery diagnosis device⌋ according to the present disclosure.

The sensing circuit 110 is configured to collect at least one of physical quantities that can be observed from the battery B. The physical quantities of the battery include a voltage, current and/or temperature of the battery B. The sensing circuit 110 and the memory 120 are an example of a ⌈data acquisition unit⌋ according to the present disclosure. The sensing circuit 110 includes a voltage detector 111 and a current detector 112. The sensing circuit 110 may further include a temperature detector 113.

The voltage detector 111 is connected to the positive and negative terminals of each of the plurality of batteries $B_1$~$B_N$ included in the battery group BG to detect a battery voltage $V_1$~$V_N$ or a voltage across the plurality of batteries $B_1$~$B_N$, respectively, and generate a voltage signal indicating voltage values of the battery voltages $V_1$~$V_N$.

The current detector 112 is connected in series to the battery group BG through a current path between the battery group BG and the inverter 31. The current detector 112 is configured to detect a charge/discharge current flowing through the battery group BG and generate a current signal indicating a current value of the charge/discharge current. Since the plurality of batteries $B_1$~$B_N$ is connected in series, the common charge/discharge current flows in the plurality of batteries $B_1$~$B_N$. The current detector 112 may include at least one of known current detection devices such as a shunt resistor and a hall effect device.

The temperature detector 113 is configured to detect a battery temperature or a temperature of the battery group BG, and generate a temperature signal indicating the detected battery temperature. The temperature detector 113 may be disposed within a predetermined distance from the battery group BG to detect the temperature that is close to the actual temperature of the battery group BG. For example, the temperature detector 113 may be attached to the surface of at least one battery B included in the battery group BG, and may detect the surface temperature of the battery B as the battery temperature. The temperature detector 113 may include at least one of known temperature detection devices such as a thermocouple, a thermistor and a bimetal.

The memory 120 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). The memory 120 may record charge/discharge data of the battery B by arranging the measured physical quantities of the battery collected by the sensing circuit 110 with time. The charge/discharge data includes a voltage time series indicating a time-dependent change of the battery voltage across the battery B and a current time series indicating a time-dependent change of the charge/discharge current flowing through the battery B. The memory 120 may store data indicating the computational operation results by the computational circuit 130. The memory 120 may store programs, algorithms, diagnosis logics and/or functions required for the control, management and diagnose of the battery B.

The communication circuit 140 is configured to support wired or wireless communication between the computational circuit 130 and the vehicle controller 2. The wired communication may be, for example, controller area network (CAN) communication, and the wireless communication may be, for example, Zigbee or Bluetooth communication. Of course, the communication protocol is not limited to a particular type and may include any type of communication protocol that supports wired/wireless communication between the computational circuit 130 and the vehicle controller 2. The communication circuit 140 may include an output device (for example, a display, a speaker) to provide information received from the computational circuit 130 and/or the vehicle controller 2 into a recognizable format for the user (driver).

The computational circuit 130 may be operably coupled to at least one of the relay 20, the sensing circuit 110 or the communication circuit 140. Being operably coupled refers to being connected directly/indirectly to transmit and receive a signal in one or two directions. The computational circuit 130 may be referred to as an 'on-board controller', and is an example of a ⌈data processing unit⌋ according to the present disclosure.

The computational circuit 130 may collect the voltage signal from the voltage detector 111, the current signal from the current detector 112 and/or the temperature signal from the temperature detector 113 periodically at a predetermined time interval or aperiodically at an irregular time interval during the charge, discharge and/or rest of the battery group BG. That is, the computational circuit 130 may acquire a detected voltage value, a detected current value and/or a detected temperature value from the analogue signals collected from the detectors 111, 112, 113 using an Analog to Digital Converter (ADC) provided therein and record them in the memory 120.

The computational circuit 130 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions.

When the electrical load 30 and/or the charger 40 operates while the relay 20 is turned on, the battery group BG goes into a charge or discharge mode. When the relay 20 is turned off, the battery group BG is changed to a rest mode.

The computational circuit 130 may turn on the relay 20 in response to the key-on signal. The computational circuit 130 may turn off the relay 20 in response to the key-off signal. The key-on signal is a signal that requests for switching from the rest to the charge or discharge. The key-off signal is a signal that requests for switching from the charge or discharge to the rest. Alternatively, the vehicle controller 2 may take responsibility for the on-off control of the relay 20 instead of the computational circuit 130.

A remote battery monitor 300 is another example of the ⌈battery diagnosis device⌋ according to the present disclosure, and may be provided in the form of a cloud server outside of the electric vehicle 1. The remote battery monitor 300 includes a communication circuit 310, memory 320 and a computational circuit 330. The communication circuit 310 and the memory 320 are another example of the ⌈data acquisition unit⌋ according to the present disclosure. The computational circuit 330 is another example of the ⌈data processing unit⌋ according to the present disclosure, and may be referred to as an 'off-board controller'. The communication circuit 310 is connected to the communication circuit 140 of the battery management system 100 through the wired/wireless communication channel to collect the charge/discharge data of the battery B from the battery management system 100 and record the collected charge/discharge data in the memory 320. The computational circuit 330 takes responsibility for the common operations and function with the computational circuit 130 of the battery management system 100 in the abnormality diagnosis of the parallel connection structure 200 included in at least one battery B of the battery group BG. It is noted that the computational circuit 130 as described below and the computational circuit 330 may have the common description.

Figure 2:
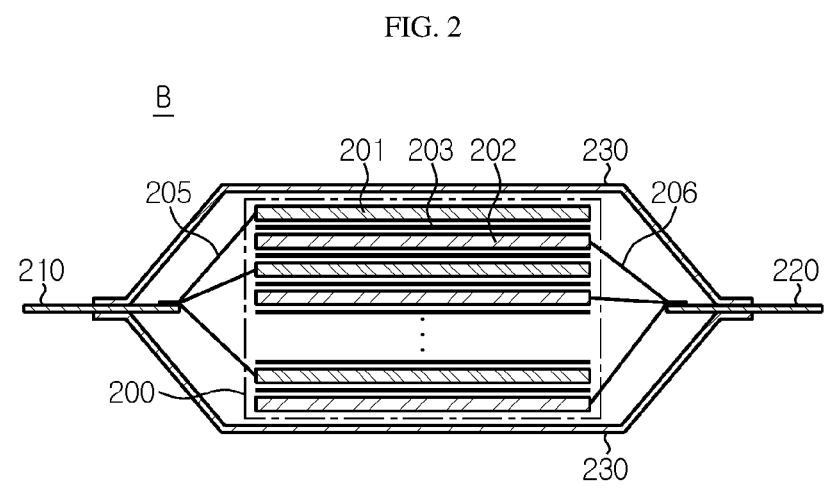
Figure 3:
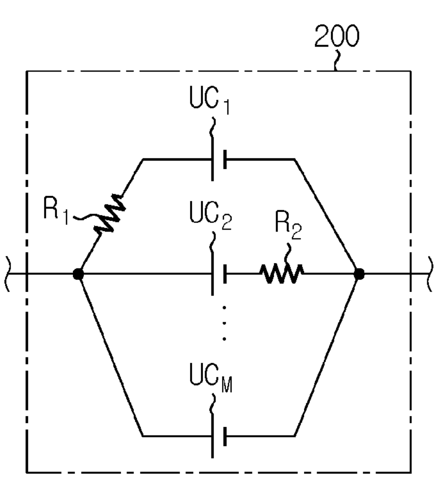
FIG. 3 is a diagram referenced in describing a first capacity abnormality (an incomplete cut-off fault) of a battery.
Figure 4:
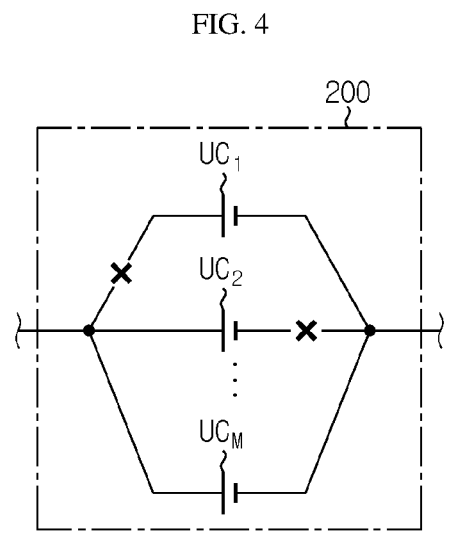

FIG. 2 is a schematic diagram exemplarily showing the battery shown in FIG. 1, FIG. 3 is a diagram referenced in describing a first capacity abnormality (an incomplete cut-off fault) of the battery, and FIG. 4 is a diagram referenced in describing a second capacity abnormality (a complete cut-off fault) of the battery.

Referring to FIG. 2, the battery B includes an electrode assembly 200, a positive electrode lead 210, a negative electrode lead 220 and a packaging material 230.

The electrode assembly 200 is an example of a parallel connection structure of unit cells $UC_1$~$UC_M$ (M is a natural number of 2 or greater). The unit cell UC includes a separator 203, a positive electrode plate 201 and a negative electrode plate 202 that is insulated from the positive electrode plate 201 by the separator 203.

The positive electrode plate 201 has a positive electrode tab 205 that is connected to one end of the positive electrode lead 210, and the negative electrode plate 202 has a negative electrode tab 206 that is connected to one end of the negative electrode lead 220.

In a state that the positive electrode tabs 205 and the negative electrode tabs 206 of the plurality of unit cells $UC_1$~$UC_M$ are coupled to one end of each of the positive electrode lead 210 and the negative electrode lead 220, the electrode assembly 200 is received in the packaging material 230 together with an electrolyte. The opposite end of each of the positive electrode lead 210 and the negative electrode lead 220 exposed through the packaging material 230 is provided as the positive terminal and the negative terminal of the battery B.

Referring to FIG. 3, the first capacity abnormality of the electrode assembly 200 refers to an irregular large change in contact resistance $R_1$, $R_2$ between the unit cells $UC_1$, $UC_2$ and the electrode leads 210, 220 due to micro damage and/or incomplete cut-off fault in the electrode tabs 205, 206 of some unit cells $UC_1$, $UC_2$ among the plurality of unit cells $UC_1$~$UC_M$. In the event of the incomplete cut-off fault, the cut portions of the electrode tabs 205, 206 are not spaced apart from each other, and as the battery B shrinks and expands, their connection and disconnection occur, and when connected, the contact area changes. While the contact resistance at the unit cells $UC_1$, $UC_2$ is kept low, all the unit cells $UC_1$~$UC_M$ are almost uniformly charged and discharged, and as the contact resistance $R_1$, $R_2$ increases, the unit cells $UC_1$, $UC_2$ are more like separated (open-circuited) from the remaining unit cells $UC_1$~$UC_M$, and as a consequence, the capacity of the battery B shows irregular behaviors such as sharp increase or reduction in great reliance on the contact resistance $R_1$, $R_2$ of the unit cells $UC_1$, $UC_2$. For example, during the action of a large tensile strength between the electrode tabs 205, 206 and the electrode leads 210, 220 of the unit cells $UC_1$, $UC_2$ due to the swelling of the battery B, the contact resistance $R_1$, $R_2$ of the unit cells $UC_1$, $UC_2$ increases, and on the contrary, as the tensile strength gradually reduces, the contact resistance $R_1$, $R_2$ of the unit cells $UC_1$, $UC_2$ reduces.

Referring to FIG. 4, the second capacity abnormality of the electrode assembly 200 is equivalent to irrecoverable rupture of some unit cells $UC_1$, $UC_2$ among the plurality of unit cells $UC_1$~$UC_M$, i.e., irreversible loss of the charge/discharge current path between the unit cells $UC_1$, $UC_2$ and the electrode leads 210, 220 due to complete cut-off fault of the unit cells $UC_1$, $UC_2$. The complete cut-off fault is different from the incomplete cut-off fault in that the electrode tabs 205, 206 or the electrode plates 201, 202 of the unit cells $UC_1$, $UC_2$ are broken into pieces too far apart to connect them again. The occurrence of the second capacity abnormality by the unit cells $UC_1$, $UC_2$ at a certain time during the fabrication or use of the battery B indicates that the unit cells $UC_1$, $UC_2$ are irrecoverably separated from the electrode leads 210, 220. Accordingly, since the unit cells $UC_1$, $UC_2$ do not make any contribution to the charge/discharge of the battery B from a specific time at which the second capacity abnormality occurred, the capacity of the battery B only relies on the capacity of the remaining unit cells $UC_1$~$UC_M$ except the unit cells $UC_1$, $UC_2$.

The computational circuit 130 periodically or aperiodically repeats a procedure of determining an estimated capacity value indicating the full charge capacity (FCC) of the battery by applying a capacity estimation model to the charge/discharge data. That is, the computational circuit 130 monitors a time-dependent change of the estimated capacity value.

The capacity estimation model is a type of algorithm that provides the estimated capacity value as an output to the input charge/discharge data, and is a combination of functions.

Specifically, the capacity estimation model may include (i) a first function to calculate a cumulative current value of the charge/discharge current of the battery B over a predetermined period of time or a variable period of time in the past from the current time series of the battery B, (ii) a second function to calculate an Open Circuit Voltage (OCV) of the battery B over a predetermined period of time or a variable period of time in the past from the voltage time series and/or the current time series of the battery B, (iii) a third function to calculate a State Of Charge (SOC) of the battery B from the OCV of the battery B using a preset OCV-SOC relationship table, and (iv) a fourth function to calculate the estimation result of the full charge capacity of the battery B, i.e., the estimated capacity value from a ratio between the cumulative current value and the SOC change value, each calculated over the common period of time. The following Equation is an example of the fourth function.

$$FCC_{t2} = \frac{\Delta Ah_{t1-t2}}{\Delta SOC_{t1-t2}} \qquad \text{< Equation >}$$

In the above Equation, $\Delta Ah_{t1-t2}$ is the cumulative current value of the charge/discharge current repeatedly measured over the period of time between the two times t1, t2, $\Delta SOC_{t1-t2}$ is the SOC change value over the period of time between the two times t1, t2, and $FCC_{t2}$ is the estimated capacity value indicating the full charge capacity at the time t2. The time t1 is earlier than the time t2, and may be the latest time that satisfies the absolute value of $\Delta Ah_{t1-t2}$ equal to or more than a reference cumulative value and/or the absolute value of $\Delta SOC_{t1-t2}$ equal to or more than a reference change value. The reference cumulative value and the reference change value may be preset to prevent degradation in accuracy of $FCC_{t2}$ due to the very small absolute value of $\Delta Ah_{t1-t2}$ and/or $\Delta SOC_{t1-t2}$.

In the calculation of the cumulative current value, the charge current may be set to a positive value and the discharge current may be set to a negative value. The time t2 is the calculation timing of the full charge capacity. When the full charge capacity is repeatedly calculated at each first time interval, those skilled in the art will easily understand that the time t2 is shifted at the first time interval.

In an example, in case that the cumulative current value and the SOC change value over the common period of time in the past are +100 Ah [ampere-hour] and +80%, respectively, the estimated capacity value of the full charge capacity is 125 Ah. In another example, in case that the cumulative current value and the SOC change value over the common period of time in the past are −75 Ah [ampere-hour] and −60%, respectively, the estimated capacity value of the full charge capacity is also 125 Ah.

The full charge capacity indicates the maximum possible capacity of the battery B, i.e., the remaining capacity of the battery B at SOC 100%. It is normal that the full charge capacity gently reduces as the battery B degrades. Accordingly, when the reduction in full charge capacity for a short time is larger than a predetermined level, it indicates the occurrence of the first capacity abnormality or the second capacity abnormality.

Figure 5:
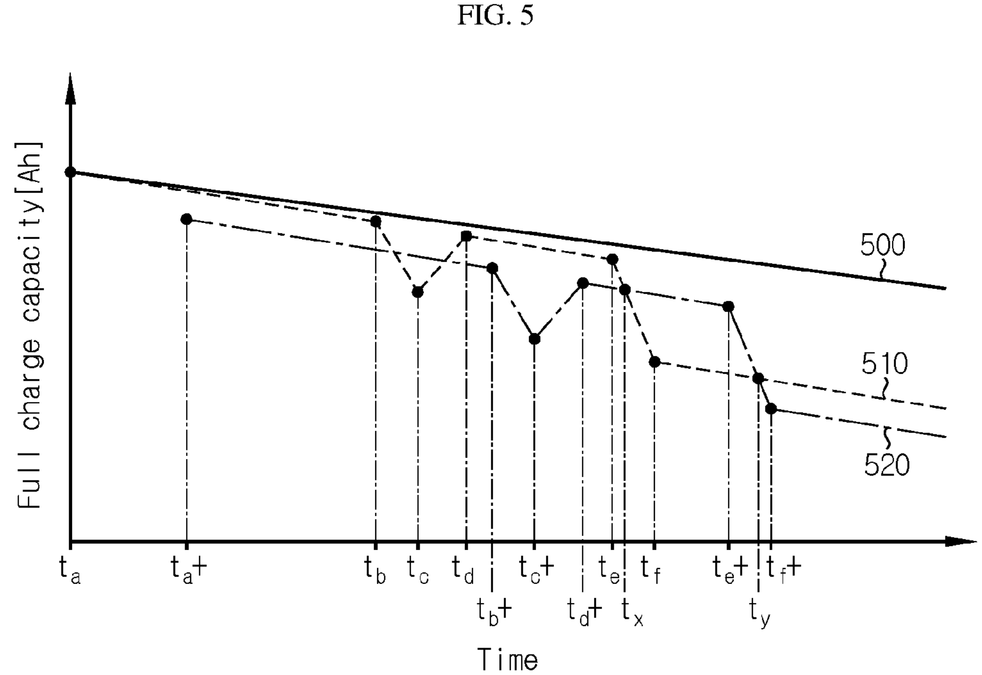
FIG. 5 is an exemplary graph referenced in describing a relationship between a capacity abnormality and a full charge capacity of a battery.

FIG. 5 is an exemplary graph referenced in describing a relationship between the capacity abnormality and the full charge capacity of the battery.

Referring to FIG. 5, a curve 500 shows a time-dependent change of the full charge capacity of a normal battery. To help an understanding, the curve 500 is plotted in a simple form to show that the full charge capacity of the normal battery linearly reduces over time.

A curve 510 shows a time-dependent change of the full charge capacity of the battery B when the first capacity abnormality and the second capacity abnormality occur in a sequential order. Describing the curve 510, as shown in FIG. 3, it shows the full charge capacity of the battery B in which the first capacity abnormality occurred due to micro damage and/or incomplete cut-off fault in the unit cells $UC_1$, $UC_2$. In the curve 510, the full charge capacity gently reduces over the period of time between time to (for example, when the battery leaves the factory) and time tb, then sharply reduces over the period of time between time tb and time tc, and sharply increases over the period of time between time tc and time td. That is, the reduction in the full charge capacity between time tb and time tc is almost recovered over the period of time between time tc and time td. This is because the contact resistance $R_1$, $R_2$ of the unit cells $UC_1$, $UC_2$ sharply increases over the period of time between time tb and time tc and returns to the normal level over the period of time between time tc and time td as described above with reference to FIG. 3.

When the first capacity abnormality lasts for a long time, it may develop (get worse) to the second capacity abnormality. Describing the curve 510, after time td, from time te to time tf, in the similar way to the period of time between time tb and time tc, there is a sharp reduction in the full charge capacity. In contrast to the behavior at the time tc~td, even after the time tf at which the sharp reduction of the full charge capacity stops, the full charge capacity fails to return to the normal level and has a similar slope to the curve 500. It results from the occurrence of the complete cut-off fault, i.e., the second capacity abnormality in the unit cells $UC_1$, $UC_2$ at or around the time te as described above with reference to FIG. 4.

The computational circuit 130 determines if the first capacity abnormality and/or the second capacity abnormality of the parallel connection structure 200 occurred, by monitoring a time-dependent change (times series) of the full charge capacity, i.e., the estimated capacity value according to the curve 510. That is, the battery diagnosis device according to the present disclosure may carry out the diagnosis logic to perform battery abnormality diagnosis according to the present disclosure in the parallel connection structure 200, and specifically, identify (or diagnose) if abnormality occurred in the unit cell included in the parallel connection structure 200 based on the diagnosis logic.

In other words, the battery diagnosis device according to the present disclosure may identify the parallel connection structure 200 including at least one faulty unit cell or a larger number of faulty unit cells than the threshold number by diagnosing the parallel connection structure 200 based on the diagnosis logic of the present disclosure, thereby diagnosing the abnormal parallel connection structure 200 (or abnormality in the parallel connection structure 200).

Specifically, the computational circuit 130 may determine if the first capacity abnormality and/or the second capacity abnormality of the parallel connection structure 200 occurred, by applying the diagnosis logic to two estimated capacity values at a first time and a second time, shifted at the first time interval by a second time interval that is equal to or more than the first time interval. The second time is later than the first time by the second time interval, and each of the first time and the second time may be set by the computational circuit 130 to increase by the first time interval at each first time interval. The first time interval may be equal to the collection cycle of the charge/discharge data (or the calculation cycle of the estimated capacity value), and the second time interval may be an integer multiple (for example, 10-fold) of the first time interval.

The diagnosis logic may include (i) a first routine that determines a threshold capacity value for the second time smaller than the estimated capacity value at the first time, and (ii) a second routine that compares the estimated capacity value at the second time with the threshold capacity value for the second time.

In the first routine, the threshold capacity value for the second time may be equal to the result of subtracting a reference capacity value from the estimated capacity value at the first time or the result of multiplying the estimated capacity value at the first time by a reference factor of less than 1. The reference capacity value may be recorded in the memory 120 as a preset value considering the total number M of unit cells $UC_1$~$UC_M$ included in the battery B and the design capacity (the full charge capacity when new) of the battery B. The reference factor may be recorded in the memory 120 as a preset value (for example, (M−1)/M, (M−2)/M) considering the total number M of unit cells $UC_1$~$UC_M$ included in the battery B. A curve 520 of FIG. 5 shows a time-dependent change of the threshold capacity value calculated by applying the first routine to the curve 510.

When the estimated capacity value at the second time is less than the threshold capacity value for the second time, the computational circuit 130 may determine that at least one of the first capacity abnormality or the second capacity abnormality occurred in the parallel connection structure 200.

The computational circuit 130 may increase a diagnosis count by 1 each time the estimated capacity value at the second time is less than the threshold capacity value for the second time. Each time the estimated capacity value at the second time is equal to or larger than the threshold capacity value for the second time, the computational circuit 130 may reset the diagnosis count to the initial value (for example, 0) or reduce the diagnosis count by 1. In response to the estimated capacity value at the second time before the diagnosis count reaches a threshold count rising to or above the threshold capacity value for the second time, the computational circuit 130 may determine that the abnormality type of the parallel connection structure 200 is the first capacity abnormality. The computational circuit 130 may determine that the second capacity abnormality of the parallel connection structure 200 occurred in response to the diagnosis count reaching the threshold count (for example, 5).

In FIG. 5, the times ta+, tb+, tc+, td+, te+ and tf+ are the times shifted from the time ta, tb, tc, td, to and tf by the second time interval in the positive direction, respectively. The curve 510 is below the curve 520 over the period of time between time tx and time ty. Accordingly, from the time tx to the time ty, the diagnosis count increases by 1 at each first time interval. The computational circuit 130 may activate a predetermined protection function associated with the second capacity abnormality of the battery B in response to the diagnosis count reaching the threshold count before the time ty.

FIG. 6 is a flowchart exemplarily showing a battery diagnosis method according to an embodiment of the present disclosure. The method of FIG. 6 may be iteratively performed at the first time interval.

Referring to FIGS. 1 to 6, in step S610, the data acquisition unit collects the charge/discharge data of the battery B. When the battery management system 100 is used as the battery diagnosis device, the sensing circuit 110 and the memory 120 correspond to the data acquisition unit. When the remote battery monitor 300 is used as the battery diagnosis device, the communication circuit 310 and the memory 320 correspond to the data acquisition unit.

In step S620, the data processing unit determines the estimated capacity value indicating the full charge capacity of the battery B. When the battery management system 100 is used as the battery diagnosis device, the computational circuit 130 corresponds to the data processing unit. When the remote battery monitor 300 is used as the battery diagnosis device, the computational circuit 330 corresponds to the data processing unit. The step S620 may include steps S622 and S624. In the step S622, the data processing unit determines the cumulative current value and the SOC change value of the battery B by inputting the charge/discharge data to the capacity estimation model. In the step S624, the data processing unit determines the estimated capacity value indicating the full charge capacity of the battery B from the ratio between the cumulative current value and the SOC change value of the battery B. The time series of the estimated capacity value is recorded in the data acquisition unit.

In step S630, the data processing unit detects the abnormality in the parallel connection structure 200 by monitoring the time-dependent change of the estimated capacity value. The step S630 may include steps S632, S634, S636, S638 and S639. In the step S632, the data processing unit determines the threshold capacity value for the second time smaller than the estimated capacity value at the first time. For example, the second time may be the calculation timing of the estimated capacity value of the current cycle, and the first time may be the calculation timing of the estimated capacity value 10 cycles earlier. In step S634, the data processing unit compares the estimated capacity value at the second time with the threshold capacity value for the second time. The estimated capacity value at the second time less than the threshold capacity value for the second time indicates that at least one of the first capacity abnormality or the second capacity abnormality occurred in the parallel connection structure 200. When a value of the step S634 is “Yes”, step S636 is performed. Otherwise, the step S638 may be performed. In the step S636, the data processing unit increases the diagnosis count by 1. In the step S638, the data processing unit resets the diagnosis count. In step S639, the data processing unit determines if the diagnosis count reached the threshold count. A value of the step S639 being “Yes” indicates that it is diagnosed that the complete cut-off fault or the second capacity abnormality occurred in at least one unit cell UC of the parallel connection structure 200.

In step S640, the data processing unit may activate the predetermined protection function. The protection function may include, for example, outputting a warning message and turning off the relay 20. The data processing unit may determine the number of faulty unit cells (complete cut-off fault) among the plurality of nit cells $UC_1$~$UC_M$ from the two estimated capacity values at the two times (for example, te, tf) in the past at a time interval that is equal to or less than the second time interval, at which the maximum reduction of the estimated capacity value is found. The number of faulty unit cells (complete cut-off fault) among the plurality of unit cells $UC_1$~$UC_M$ may be determined. The number of faulty unit cells may be determined to be equal to the maximum integer that is not larger than $\Delta Ah_{max}/(Ah_p/M)$. $Ah_p$ is the estimated capacity value at the earlier time te among the two times (for example, te, tf). $\Delta Ah_{max}$ is the maximum reduction of the full charge capacity over the period of time between the two times (for example, te, tf) before the detection timing of the abnormality in the parallel connection structure 200, and is the result of subtracting the estimated capacity value at the later time tf from the estimated capacity value at the earlier time te. For example, $Ah_p$=122 Ah, $\Delta Ah_{max}$=27 Ah, M=10, 2≤27 Ah/(122 Ah/10) <3, so the number of faulty unit cells is determined to be 2. The warning message may include identification information of the faulty battery (for example, $B_1$) among the plurality of batteries$_1$~$B_N$. The warning message may include data indicating the number of faulty unit cells (for example, $UC_1$, $UC_2$) included in the parallel connection structure 200 of the faulty battery (for example, $B_1$).

The embodiments of the present disclosure described hereinabove are not implemented only through the apparatus and method, and may be implemented through programs that perform the functions corresponding to the configurations of the embodiments of the present disclosure or recording media having the programs recorded thereon, and such implementation may be easily achieved by those skilled in the art from the disclosure of the embodiments described above.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and all or some of the embodiments may be selectively combined to allow various modifications.

DESCRIPTION OF REFERENCE NUMERALS

| | |
|---|---|
| 1: Electric vehicle | 2: Vehicle controller |
| 10: Battery pack | 20: Relay |
| 30: Electrical load | 40: Charger |
| 100: Battery management system (an example of a ⌈battery diagnosis device⌋) | |
| 110: Sensing circuit | 120: Memory |
| 130: Computational circuit | 140: Communication circuit |
| 300: Remote battery monitor (another example of a ⌈battery diagnosis device⌋) | |
| 310: Communication circuit | 320: Memory |
| 330: Computational circuit | |

What is claimed is:

1. A battery diagnosis device for a battery including a parallel connection structure of unit cells, the battery diagnosis device comprising:

a processor; and memory having programmed thereon instructions that, when executed, are configured to cause the processor to:

receive charge/discharge data including a voltage time series indicating a time-dependent change of a voltage across the battery and a current time series indicating a time-dependent change of a charge/discharge current flowing through the battery;

determine first estimated capacity value of the battery at a first time, and a second estimated capacity value of the battery at a second time based on the charge/discharge data, the first estimated capacity value indicating a full charge capacity of the battery at the first time, and the second estimated capacity value indicating a full charge capacity of the battery at the second time after the first time;

determine a threshold capacity value at the second time based on (i) the first estimated capacity value of the battery at the first time and (ii) a reference capacity value;

compare the second estimated capacity value of the battery at the second time with the threshold capacity value at the second time;

diagnose an abnormality indicating a cut-off fault in the parallel connection structure based on the comparison; and in response to diagnosing the abnormality, perform a protection function by turning off a relay connecting the battery and a charging device.

2. The battery diagnosis device according to claim 1, wherein the instructions are further configured to cause the processor to determine a cumulative current value and a state of charge (SOC) change value of the battery, and determine the first estimated capacity value and the second estimated capacity value from a ratio between the cumulative current value and the SOC change value.

3. The battery diagnosis device according to claim 1, wherein the instructions are further configured to cause the processor to diagnose the abnormality in the parallel connection structure based on the first estimated capacity values and the second estimated capacity value at the first time at a first time interval and the second time shifted by a second time interval which is equal to or larger than the first time interval.

4. The battery diagnosis device according to claim 3, wherein the threshold capacity value at the second time is smaller than the first estimated capacity value at the first time.

5. The battery diagnosis device according to claim 4, wherein the instructions are further configured to cause the processor to determine the threshold capacity value by subtracting the reference capacity value from the first estimated capacity value at the first time.

6. The battery diagnosis device according to claim 4, wherein the instructions are further configured to cause the processor to:

when the second estimated capacity value at the second time is less than the threshold capacity value at the second time, increase a diagnosis count, and diagnose that the parallel connection structure is faulty in response to the diagnosis count reaching a threshold count.

7. The battery diagnosis device according to claim 4, wherein the instructions are further configured to cause the processor to determine a number of faulty unit cells among the plurality of unit cells from the two estimated capacity values at two past times at a time interval which is equal to or less than the second time interval, at which a maximum reduction of the full charge capacity is found, when it is diagnosed that the parallel connection structure is faulty.

8. A battery pack comprising the battery diagnosis device according to claim 1.

9. An electric vehicle comprising the battery pack according to claim 8.

10. A battery diagnosis method for a battery including a parallel connection structure of unit cells, the battery diagnosis method comprising:

receiving, by one or more processors, charge/discharge data including a voltage time series indicating a time-dependent change of a voltage across the battery and a current time series indicating a time-dependent change of a charge/discharge current flowing through the battery;

determining, by the one or more processors, a first estimated capacity value of the battery at a first time, and a second estimated capacity value of the battery at a second time based on the charge/discharge data, the first estimated capacity value indicating a full charge capacity of the battery at the first time, and the second estimated capacity value indicating a full charge capacity of the battery at the second time after the first time;

determining, by the one or more processors, a threshold capacity value at the second time based on (i) the first estimated capacity value of the battery at the first time and (ii) a reference capacity value;

comparing, by the one or more processors, the second estimated capacity value of the battery at the second time with the threshold capacity value at the second time;

diagnosing, —by the one or more processors, an abnormality indicating a cut-off fault in the parallel connection structure based on the comparison; and in response to diagnosing the abnormality, performing, by the one or more processors, a protection function by turning off a relay connecting the battery and a charging device.

11. The battery diagnosis method according to claim 10, wherein determining, by the one or more processors, the estimated capacity value indicating the full charge capacity of the battery comprises:

determining, by the one or more processors, a cumulative current value and a state of charge (SOC) change value of the battery by inputting the charge/discharge data to a capacity estimation model; and determining, by the one or more processors, the first estimated capacity value and the second estimated capacity value from a ratio between the cumulative current value and the SOC change value.

12. The battery diagnosis method according to claim 10, wherein diagnosing, by the one or more processors, the abnormality in the parallel connection structure is based on the first estimated capacity values and the second estimated capacity value at the first time at a first time interval and a second time shifted by the second time interval which is equal to or larger than the first time interval.

13. The battery diagnosis method according to claim 12, wherein the threshold capacity value at the second time is smaller than the first estimated capacity value at the first time.

* * * * *